United States Patent
Amano

(10) Patent No.: US 7,423,355 B2
(45) Date of Patent: Sep. 9, 2008

(54) POWER CONTROLLER, APPARATUS PROVIDED WITH BACKUP POWER SUPPLY, PROGRAM FOR CONTROLLING POWER, AND METHOD FOR CONTROLLING POWER

(75) Inventor: Kazuhiko Amano, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 63 days.

(21) Appl. No.: 11/072,320

(22) Filed: Mar. 7, 2005

(65) Prior Publication Data
US 2006/0133181 A1 Jun. 22, 2006

(30) Foreign Application Priority Data
Dec. 20, 2004 (JP) ............................. 2004-367972

(51) Int. Cl.
*H02J 7/00* (2006.01)
(52) U.S. Cl. ........................................................ 307/65
(58) Field of Classification Search ................. 307/64, 307/65
See application file for complete search history.

(56) References Cited

U.S. PATENT DOCUMENTS

| | | | |
|---|---|---|---|
| 6,201,319 B1 * | 3/2001 | Simonelli et al. | 307/26 |
| 6,215,202 B1 * | 4/2001 | Luongo et al. | 307/64 |
| 6,392,383 B1 * | 5/2002 | Takimoto et al. | 320/115 |
| 6,703,722 B2 * | 3/2004 | Christensen | 307/71 |
| 6,803,678 B2 * | 10/2004 | Gottlieb et al. | 307/66 |
| 6,867,701 B2 * | 3/2005 | Lawrence et al. | 340/635 |
| 2002/0120368 A1 * | 8/2002 | Edelman et al. | 700/286 |
| 2005/0040785 A1 * | 2/2005 | Barnes et al. | 320/101 |

FOREIGN PATENT DOCUMENTS

| | | |
|---|---|---|
| JP | 05-333969 | 12/1993 |
| JP | 10-052053 | 2/1998 |
| JP | 2000-184608 | 6/2000 |

* cited by examiner

*Primary Examiner*—Michael J Sherry
*Assistant Examiner*—Michael Rutland Wallis
(74) *Attorney, Agent, or Firm*—Staas & Halsey LLP

(57) ABSTRACT

The present invention constructs a flexible power supply backup system corresponding to electronic devices (apparatuses) at low cost, and realizes reliable operation of the apparatuses. There is provided a power controller 1 that controls power of an apparatus 100 provided with a backup power supply for power supply, which includes a power failure state determination unit 21 that determines the power failure state of the power supply, a power supply installation state determination unit 22 that determines the installation state of the backup power supplies 3, 7, etc. installed in the apparatus 100, and a power control unit 23 that, in case the power failure state is determined by the power failure state determination unit 21, controls power using the backup power supply based on determination result by the power failure state determination unit 21 and determination result by the power supply installation state determination unit 22.

18 Claims, 7 Drawing Sheets

FIG. 6

|  | First battery unit | Second battery unit | Third battery unit | Dedicated UPS or General-purpose UPS |
|---|---|---|---|---|
| Case 1 | ○ | --- | --- | --- |
| Case 2 | --- | ○ | --- | --- |
| Case 3 | --- | ○ | ○ | --- |
| Case 4 | --- | --- | --- | ○ |
| Case 5 | ○ | ○ | --- | --- |
| Case 6 | ○ | --- | --- | ○ |

POWER CONTROLLER, APPARATUS PROVIDED WITH BACKUP POWER SUPPLY, PROGRAM FOR CONTROLLING POWER, AND METHOD FOR CONTROLLING POWER

BACKGROUND OF THE INVENTION

1. Field of the Invention

The present invention relates to an apparatus provided with backup power supply for power supply which is supplied generally such as commercial power supply, a power controller that controls power of the apparatus, a program for controlling power, and a method for controlling power.

2. Description of Related Art

Conventionally, apparatuses for processing electronic data such as information processing apparatuses are provided with a backup power supply such as a UPS so as to prevent processed data from being lost or avoid malfunction during operation due to shutoff of power supply or temporary blackout.

Such an apparatus monitors the state of voltage, current, etc. of a general power supply (AC input power supply) (step S51), and in the case where the voltage value becomes less than a stipulated voltage value (V1) being a threshold value (step S52, Y), and when it is determined that the state with the voltage value less than the stipulated voltage value continues for a preset period of time or longer (step S53, Y), the power supply is switched to a backup power supply (step S54), as shown in FIG. 7 indicative of one example of the operation. Thus, at the time of power failure or temporary blackout of the power supply, operation of the apparatus can be maintained. In this case, the preset period of time is a short period of time during which stored electricity by a capacitor or the like can be used. There is a case in which the power supply is switched to a backup power supply immediately after the power supply voltage becomes less than the stipulated voltage value.

In the conventional technique, as described above, in case the power supply voltage becomes less than a threshold value, or the state with the voltage value less than the threshold value continues for a preset period of time or longer, the power supply is switched to a uniformly determined backup power supply, and the processing thereof is subjected to a uniquely set process.

On the other hand, in the case where backup power supplies of large and small electric capacities are installed, efficient operation of the apparatus can be maintained by making full use of these various backup power supplies depending on patterns of the power failure.

For example, when an apparatus is immediately restored from the power failure state to the normal state, it is desired that the apparatus be operated under the normal state using a backup power supply having large electric capacity which can drive the entire apparatus. On the other hand, when an apparatus is not immediately restored from the power failure state and the apparatus cannot be backed up even though a backup power supply having large electric capacity is used, it is necessary to save important electronic data immediately before shut down of the apparatus. In this case, a backup power supply having small electric capacity is used to perform such an important processing, which makes the operation of the apparatus reliable.

However, in the conventional technique, various backup power supplies are not properly used depending on patterns of the power failure, which cannot maintain efficient operation of the apparatus at the time of power failure. Furthermore, installing a backup power supply having large electric capacity on all apparatuses is not appropriate in view of cost and importance of operation state of the apparatus.

Furthermore, there are many patterns of the power failure or temporary blackout. For example, when temporary power failures often arise and a backup power supply is repeatedly used before being fully charged, stored electricity of the backup power supply is lower than that of the initial state. In this case, when the backup power supply is used similarly as the case of the initial power failure, operation of the apparatus cannot be maintained sufficiently.

SUMMARY OF THE INVENTION

The present invention has been made in consideration of the conventional drawbacks described above, and has as its object to provide a power controller, an apparatus provided with a backup power supply, a program for controlling power, and a method for controlling power, which can construct a flexible power supply backup system corresponding to electronic apparatuses at low cost and realize reliable operation of the apparatuses by determining the power failure state corresponding to an installed backup power supply and performing backup operation using the backup power supply corresponding to the power failure state.

According to the present invention, to overcome the above-mentioned drawbacks, there is provided a power controller that controls power of an apparatus provided with a backup power supply for power supply, including: a power failure state determination unit that determines the power failure state of the power supply; a power supply installation state determination unit that determines the installation state of the backup power supply of the apparatus; and a power control unit that, in case the power failure state is determined by the power failure state determination unit, controls power using the backup power supply based on determination result by the power failure state determination unit and determination result by the power supply installation state determination unit.

In the power controller, the power supply installation state determination unit determines the installation state of the backup power supply, and the power failure state determination unit determines plural power failure states corresponding to the usage pattern of the backup power supply based on the installation state of the backup power supply which is determined by the power supply installation state determination unit.

Further, the power control unit can vary drive performance contents of the apparatus as the usage pattern by the backup power supply depending on the plural power failure states which are determined by the power failure state determination unit.

Furthermore, in the power controller, the installation state of the backup power supply that is determined by the power supply installation state determination unit includes information concerning electric capacity of the backup power supply, or information concerning the electric capacity as well as its charging state.

Moreover, in the power controller according to the present invention, the power failure state determination unit uses power supply voltage monitoring result by a power supply voltage monitor unit that monitors the voltage of the power supply, and determines a predetermined power failure state under the condition that the power supply voltage becomes less than a predetermined value.

Here, the power failure state determination unit uses time of a timer that clocks time together with the power supply voltage monitoring result, and clocks a period of time during which the power supply voltage becomes less than a predetermined value using the timer, and determines a predetermined power failure state based on thus clocked period of time.

Still more, the power failure state determination unit determines a first power failure state based on the power supply voltage monitoring result, and when the power failure state determination unit determines the first power failure state, in case it is determined that a first backup power supply alone is installed by the power supply installation state determination unit, the power control unit makes a first predetermined processing be performed using the first backup power supply.

Further, in the power controller according to the present invention, the power failure state determination unit determines a first power failure state based on the power supply voltage monitoring result, and when the power failure state determination unit determines the first power failure state, in case it is determined that the first backup power supply as well as a second backup power supply whose electric capacity is larger than that of the first backup power supply are installed by the power supply installation state determination unit, the power control unit makes a second predetermined processing be performed using the second backup power supply.

Furthermore, in the power controller according to the present invention, the power failure state determination unit determines a second power failure state under the condition that the state with the power supply voltage less than the predetermined value continues for a preset period of time or longer, and when the power failure state determination unit determines the second power failure state, the power supply installation state determination unit determines remaining amount of the second backup power supply, and, based on the determination result, the power control unit makes the first predetermined processing be performed using any one of the first backup power supply and the second backup power supply.

The power controller further includes a power failure history information storage unit that stores power failure history information, and the power control unit controls power using the backup power supply further based on the power failure history information in addition to determination result by the power failure state determination unit and determination result by the power supply installation state determination unit.

Further, according to the present invention, there is provided an apparatus provided with a backup power supply that backs up electric power of power supply at the time of power failure, including: a backup power supply having predetermined electric capacity; a power failure state determination unit that determines the power failure state of the power supply; a power supply installation state determination unit that determines the installation state of the backup power supply of the apparatus; and a power control unit that, in case the power failure state is determined by the power failure state determination unit, controls power using the backup power supply based on determination result by the power failure state determination unit and determination result by the power supply installation state determination unit.

In the apparatus provided with a backup power supply, the backup power supply includes a first backup power supply having first electric capacity and a second backup power supply having electric capacity which is larger than that of the first backup power supply, and in case the power failure state is determined by the power failure state determination unit, the power control unit selectively switches the first backup power supply and the second backup power supply based on determination result by the power failure state determination unit and determination result by the power supply installation state determination unit to supply the apparatus with power.

Note that, the apparatus is a RAID apparatus.

Further, according to the present invention, there is provided a program for controlling power that makes a computer control power of an apparatus provided with a backup power supply for power supply, the program makes the computer carry out: a power failure state determination step of determining the power failure state of the power supply; a power supply installation state determination step of determining the installation state of the backup power supply of the apparatus; and a power control step of, in case the power failure state is determined in the power failure state determination step, controlling power using the backup power supply based on determination result in the power failure state determination step and determination result in the power supply installation state determination step.

According to the present invention, there is further provided a method for controlling power that controls power of an apparatus provided with a backup power supply for power supply, including: a power failure state determination step of determining the power failure state of the power supply; a power supply installation state determination step of determining the installation state of the backup power supply of the apparatus; and a power control step of, in case the power failure state is determined in the power failure state determination step, controlling power using the backup power supply based on determination result in the power failure state determination step and determination result in the power supply installation state determination step.

According to the present invention, there are provided a power controller, an apparatus provided with a backup power supply, a program for controlling power, and a method for controlling power, which can construct a flexible power supply backup system corresponding to electronic devices (apparatuses) at low cast and realize reliable operation of the apparatuses.

BRIEF DESCRIPTION OF THE DRAWINGS

FIG. 6 shows a table indicative of the installation state of backup power supplies.

DETAILED DESCRIPTION OF THE PREFERRED EMBODIMENTS

Preferred embodiments of the present invention will be described below with reference to the accompanying drawings.

Figure 1:
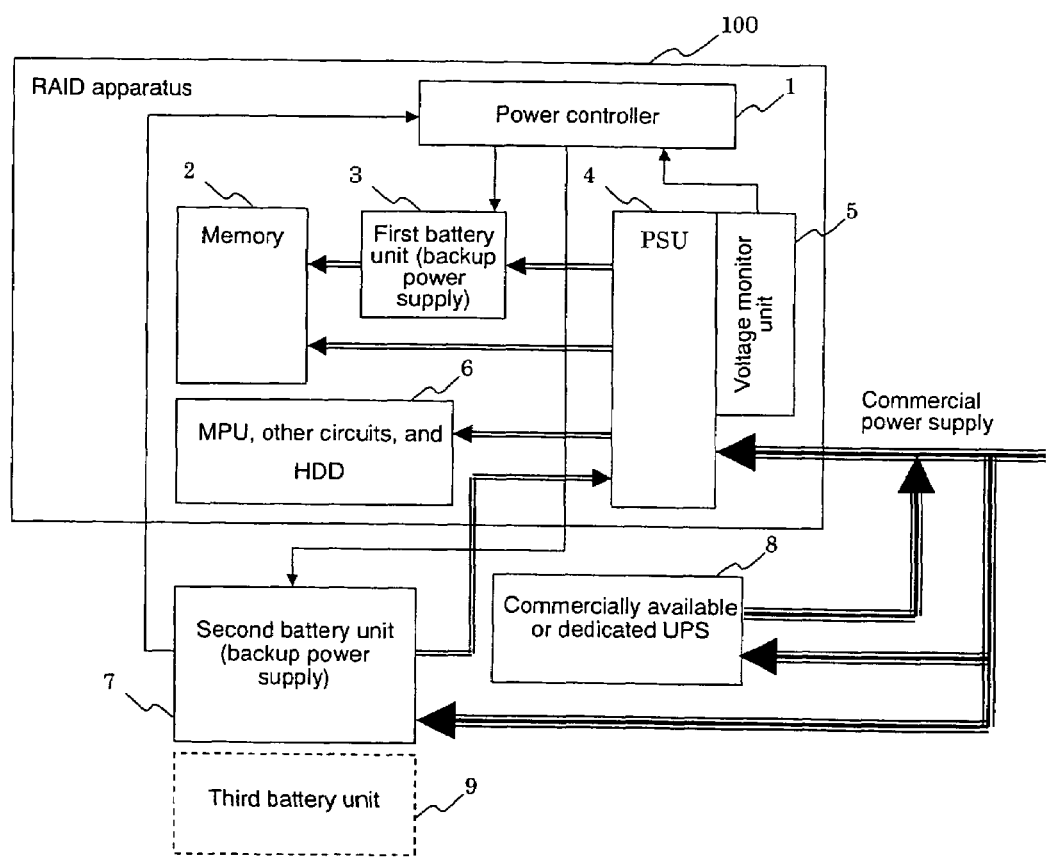
FIG. 1 shows a block diagram indicative of general configuration of an apparatus provided with a power controller according to an embodiment of the present invention.
Figure 2:
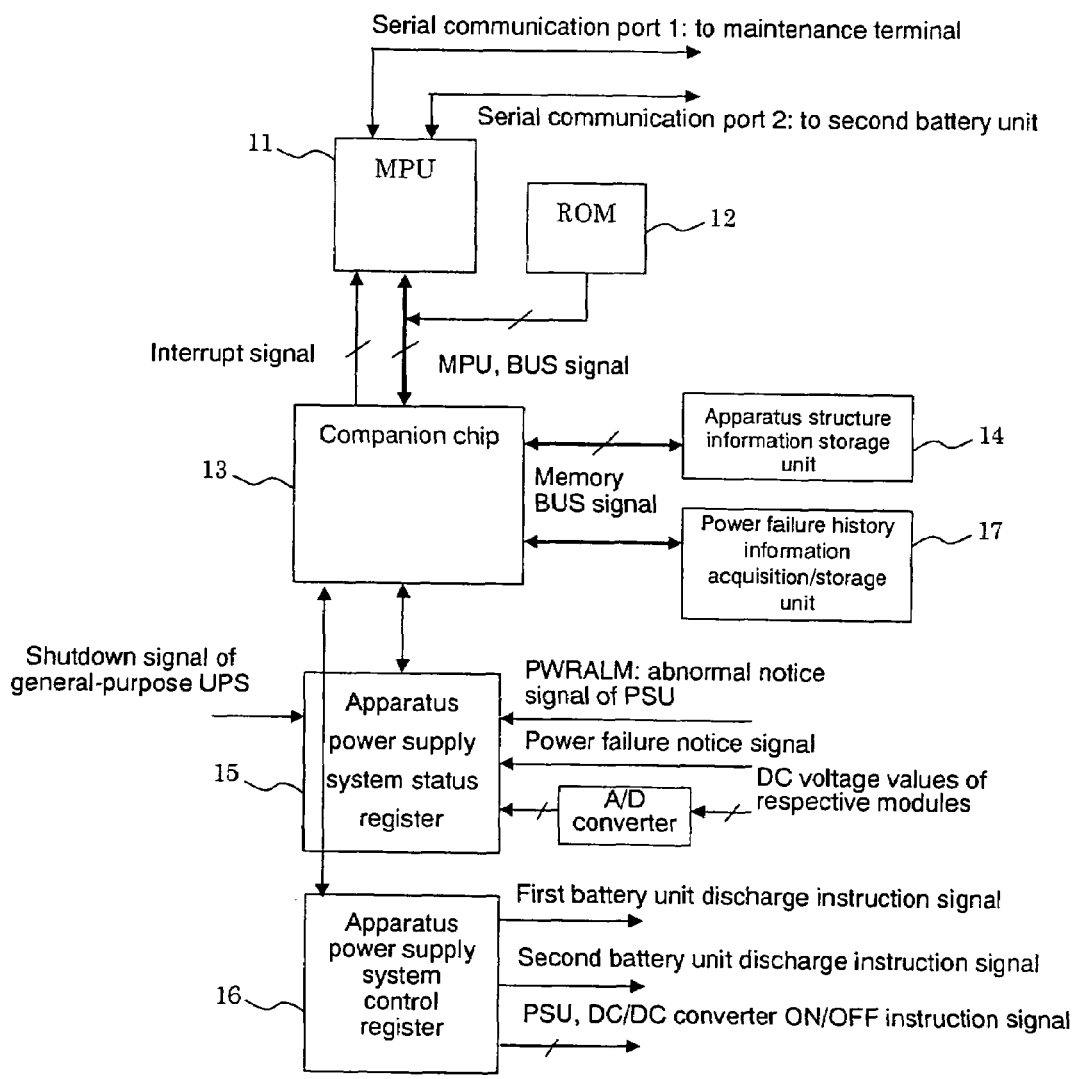
FIG. 2 shows a block diagram indicative of circuit configuration of the power controller according to the embodiment of the present invention.
Figure 3:
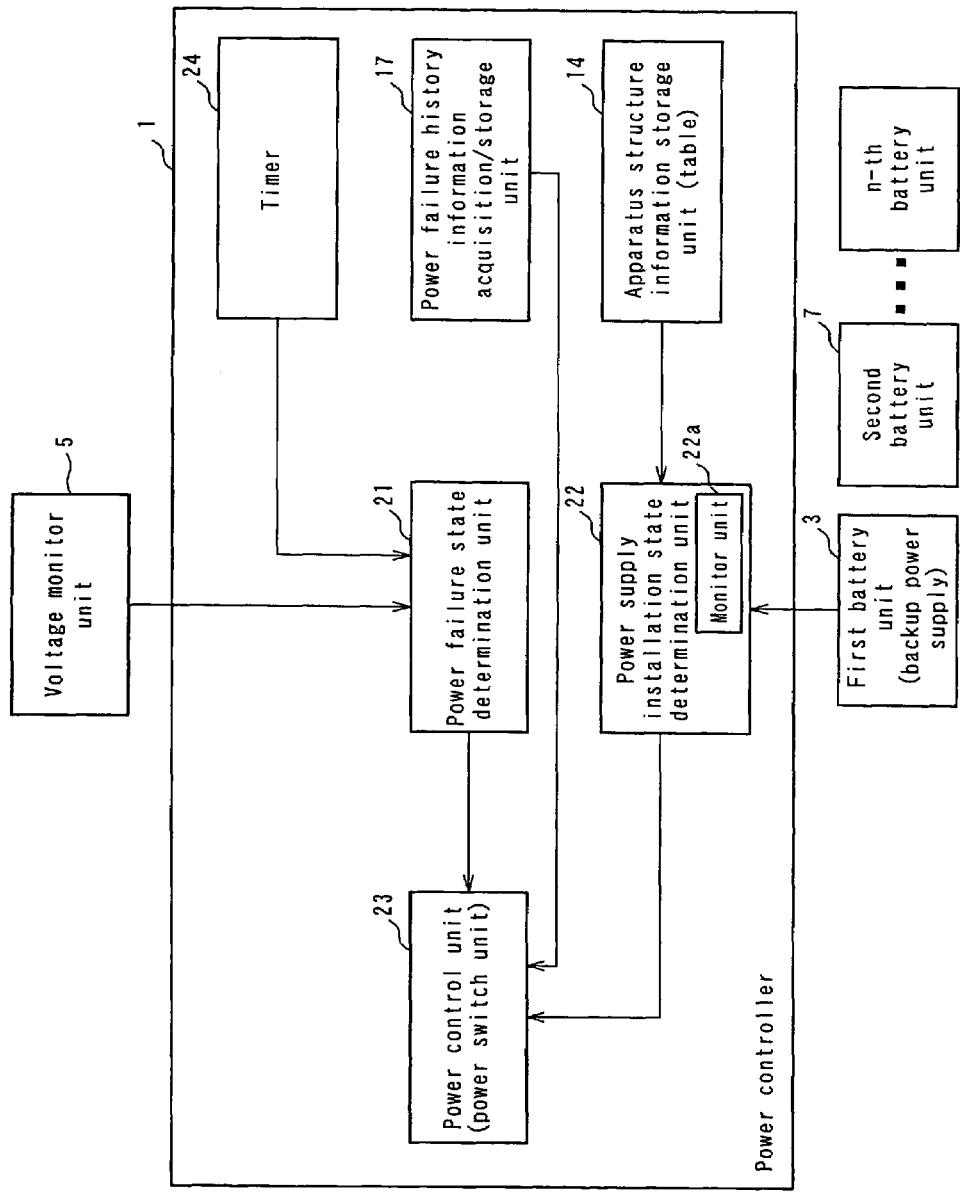
FIG. 3 shows a functional block diagram indicative of configuration of the power controller according to the embodiment of the present invention.
Figure 4:
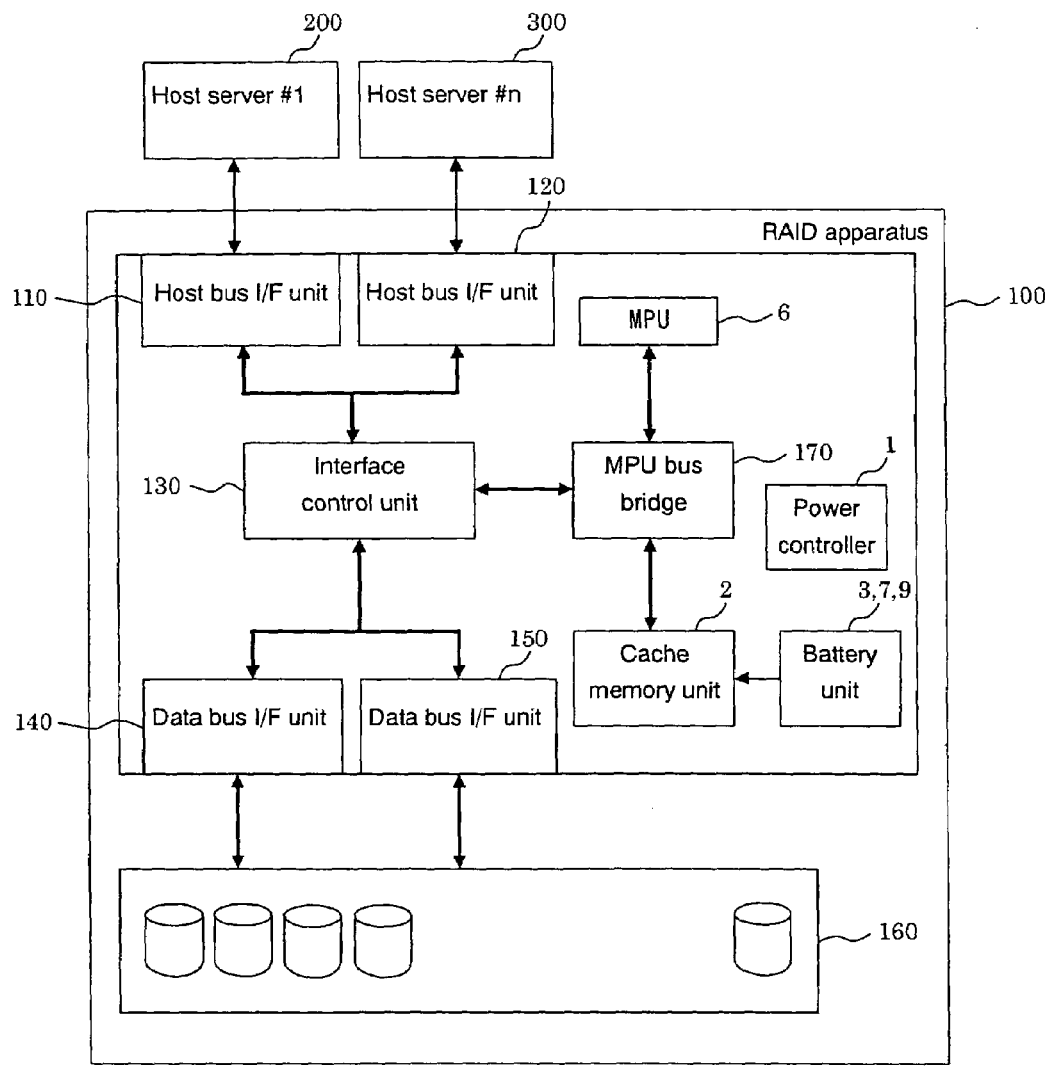
FIG. 4 shows a block diagram indicative of a RAID apparatus provided with the power controller according to the embodiment.

FIG. 1 shows a block diagram indicative of general configuration of an apparatus provided with a power controller according to an embodiment of the present invention, FIG. 2 shows a block diagram indicative of circuit configuration of the power controller according to the embodiment, FIG. 3 shows a functional block diagram indicative of configuration of the power controller according to the embodiment, and FIG. 4 shows a block diagram indicative of a RAID apparatus provided with the power controller according to the embodiment.

The apparatus shown in FIG. 1 is, for example, a RAID (Redundant Array of Inexpensive Disks) apparatus 100, which includes a power controller 1 of the present invention, a memory 2, a first battery unit 3 that configures the first backup power supply, a PSU (Power Supply Unit) 4, a voltage monitor unit 5 that monitors power supply voltage, an MPU (Microprocessor Unit) or a CPU (Central Processing Unit) and an HDD and other circuits 6.

The RAID apparatus 100 may be optionally provided with a second battery unit 7 that has electric capacity larger than that of the first battery unit 3 and configures the second backup power supply, in addition to the first battery unit 3, and may be optionally provided with a UPS (Uninterrupted Power Supply) 8 that is a commercially available or dedicated standby power supply. The apparatus may be optionally provided with a third battery unit 9 as a battery for enlarging the function of the second battery unit 7 as a backup power supply as shown by a dotted line.

As shown in FIG. 2, the power controller 1 includes an MPU 11 that has a serial communication port which is connected to a maintenance terminal, not shown, and a serial communication port which is connected to the second battery unit 7, a ROM (Read Only Memory) 12 that has control programs and data stored therein, an apparatus power supply system status register 15 that represents power supply system information of the RAID apparatus 100, an apparatus power supply system control register 16 that controls and instructs the power supply system of the RAID apparatus 100, an apparatus structure information storage unit 14 that has stored therein apparatus structure information which is necessary in supplying the RAID apparatus 100 with power, a power failure history information acquisition/storage unit 17 that acquires and stores power failure history information, and a companion chip 13 that is arranged among the registers 15, 16, storage units 14, 17, MPU 11 and transmits information.

In FIG. 2, the maintenance terminal is used to write respective structure information of the apparatus including electric capacity of the battery to the apparatus structure information storage unit 14, and change or delete the structure information. The power failure history information acquisition/storage unit 17 acquires information concerning power failures that arose in the past (for example, within a preset period of time) and stores thus acquired information as history information, which information can be referred to when controlling power.

The apparatus power supply system status register 15 acquires a shutdown signal of the UPS 8, an abnormal notice signal of the PSU 4, power failure notice information from the voltage monitor unit 5, the state of DC voltage values of respective modules, and displays thus acquired information.

The apparatus power supply system control register 16 sends a discharge instruction signal to a battery unit to be used when controlling power at the time of a power failure, and sends ON/OFF instruction to respective modules such as the PSU 4 and a DC/DC converter.

In above-described configuration, as shown in FIG. 3, the power controller 1 according to the embodiment of the present invention includes a power failure state determination unit 21 that determines the power failure state based on monitor voltage of the voltage monitor unit 5, a power supply installation state determination unit 22 that determines the installation state of the backup power supply installed in the RAID apparatus 100, and a power control unit 23 that, in case the power failure state is determined by the power failure state determination unit 21, controls power using the backup power supply based on determination result by the power failure state determination unit 21 and determination result by the power supply installation state determination unit 22.

The power controller 1 includes a timer 24, and the power failure state determination unit 21 can determine the power failure state using the monitor voltage as well as a period of power failure time by the timer 24. Furthermore, the power controller 1 includes the apparatus structure information storage unit 14, and the power supply installation state determination unit 22 determines the apparatus structure of the apparatus structure information storage unit 14, and the power control unit 23 acquires the apparatus structure when controlling power. Moreover, the power controller 1 includes the power failure history information acquisition/storage unit 17 that stores power failure history information, and the power control unit 23 can highly control power based on information stored in the power failure history information acquisition/ storage unit 17.

The power supply installation state information includes information concerning installed power supplies (backup power supplies) as well as electric capacity and remaining electric capacity of the respective installed power supplies, as shown in FIG. 6. Accordingly, the power supply installation state determination unit 22 has a monitor unit 22a that monitors voltages of the battery units, and can properly determines remaining electric capacity of the battery units to send the determination result to the power control unit 23.

The power failure state means the state of power failure (power failure condition) that is determined (set up) corresponding to usage pattern stipulated by the manner of using the respective installed power supplies concerning the method of backup for the combination of the respective power supplies. For example, in a flow chart shown in FIG. 5 to be described later, the power failure state means a condition fulfilling determination of step S3 and step S8. In this case, power failure state fulfilling step S3 means power failure state set up corresponding to usage patterns 1 and 2, while power failure state fulfilling step S8 means power failure state set up corresponding to usage patterns 3 and 4.

In the present embodiment, the power control unit 23 carries out power control that is stipulated by programs using respective determination results, and carries out power control under predetermined usage pattern corresponding to installed power supplies.

According to the functional block diagram indicative of the RAID apparatus 100 shown in FIG. 4, the RAID apparatus 100 includes the power controller 1, the battery units 3, 7 and 9, host bus I/F units 110, 120, an interface control unit 130, data bus I/F units 140, 150, an MPU bus bridge 170, the MPU 6, the cache memory unit 2, and an HDD unit 160.

Next, operations of the embodiment according to the present invention that correspond to respective installation states, will be explained.

(First Operation: Case in which First Battery Unit 3 and Second Battery Unit 7 are Installed)

The first operation will be explained using a flow chart shown in FIG. 5.

At first, the voltage monitor unit 5 monitors voltage of an AC input power supply (S1), and when it is determined that the voltage is equal to or less than a stipulated voltage value (V1) (S2, y) as well as it is determined that the state continues for a stipulated period of time (T1) or longer (S3, y), the power failure state (first power failure state) is determined. The stipulated period of time (T1) is based on the electric discharge effect of a capacitor or the like similar to the conventional technique. On the other hand, the power failure state may be determined immediately after it is determined that the voltage becomes less than the stipulated voltage value (V1) (S2), skipping step S3.

When the power failure state is determined, in step S4, it is determined whether the second battery unit is installed or not. In case it is determined that the second battery unit is not installed (S4, n), discharging of the first battery unit is started to evacuate cache data to the memory (usage pattern 1). In this case, bits indicating that the apparatus is shut down due to power failure are made to remain in the nonvolatile memory.

In case the first battery unit alone is installed, when the voltage of the commercial power supply goes down or the power failure is brought about, electric power stored in the capacity of the PSU 4 will run out to shut down the apparatus. Generally, the output of the PSU 4 can keep the rated value for several ms to several tens ms from the time point when the commercial power goes down. Accordingly, when detecting the voltage reduction, the voltage monitor unit 5 at the input portion of the PSU 4 sends an alarm (ALM) signal to the power controller 1.

Since operable time of the RAID apparatus 100 is several tens ms at the utmost, the power controller 1, which has received the ALM signal indicative of the voltage reduction, makes the memory 2 in refresh mode to protect current data. Other circuits will stop shortly after the power supply voltage goes down.

After the power supply is restored and the apparatus is started up, the system can be operated from the power failure state using protected data stored in the memory 2.

On the other hand, in step S4, in case it is determined that the second battery unit is installed (S4, y), discharging of the second battery unit is started to continue the general operation of the apparatus (S5) (usage pattern 2).

Then, the voltage will further be monitored (S7), and when it is determined that the state of lowered voltage continues for a stipulated period of time (T2) or longer (S8, y), the second power failure state is determined. Then, in step S9, it is determined whether backup of writing data to the HDD using remaining capacity of the second battery unit (remaining electric capacity) is possible or not.

In the determination of step S9, remaining capacity is determined by detecting and determining the voltage of the battery unit by the monitor unit 22a. On the other hand, the remaining capacity may be determined using power failure history information, which is obtained from the power failure history information acquisition/storage unit 17. For example, when power failures are often arise, there is a possibility that the battery unit is not sufficiently charged. Even in this case, the remaining capacity of the battery can be determined using history information, and the determination in step S9 can be performed by the determination result. As the history information, a count value indicative of the number of counting power failures of predetermined length or longer which are brought about during a preset period of time is used. In case the count value exceeds a predetermined value, it is possible to determine the remaining electric capacity is insufficient and backup of writing data to the HDD cannot be performed.

Then, in step S9, in case it is determined that the backup is possible (S9, y), cache data is rewritten to the HDD (S11), and the apparatus is stopped (S12) (usage pattern 3).

On the other hand, in step S9, in case it is determined that the backup is impossible (S9, n), cache data is retained using the first battery unit (S10) (usage pattern 4). In this case, after writing bits indicating that the apparatus is shut down due to power failure to a nonvolatile memory, discharging of the second battery unit is stopped. At this time, the apparatus is stooped due to voltage reduction. In the determination of step S9, in case it is determined that rewriting cache data to the HDD is impossible, the cache data may be retained in the memory using the second battery unit. In this case, the first battery unit may not be required to be installed.

As shown in above-described operation, in case of controlling power in view of the first battery unit and the second battery unit, when power failure is brought about, the apparatus is firstly backed up using the second battery unit. When the electric power is restored, the operation is continued, and when the electric power is not restored for a while, the memory data can be protected using the first battery unit.

In this case, the battery unit is made to operate for several seconds at the time of temporary (instantaneously arising) power failure, enabling setup of the general operation at the time of consecutive power failures brought about during a short period of time. In case the second battery unit has large electric capacity to a certain extent and no matter how little the power supply voltage becomes unstable, the second battery unit is immediately discharged to operate the apparatus to monitor the voltage state for a preset period of time.

Then, when it is determined that the electric power is restored to the stable state, the power is switched to the commercial power supply again, and when it is determined that the electric power is not restored, the first battery unit is used to safely stop the apparatus before remaining capacity of the second battery unit runs out. In this case, depending the remaining capacity of the second battery unit, with degree of freedom to some extent, it is possible to determine whether data to be evacuated should be evacuated to the HDD or should be retained in the memory using the first battery unit.

Immediately before the power failure, power supply voltage often becomes unstable. In case the battery of the backup power supply operates responding to the unstable voltage and then restorations of the primary voltage (AC power supply) are repeated to finally come into the power failure, it can be considered that electric capacity of the second battery unit has been already used up.

In this case, at the time of consecutive power failures arising during a short period of time, a count value indicative of the number of counting power failures and restorations is used as the power failure history information, and when consecutive voltage reductions of more than stipulated number of times are counted, it is determined that the second battery unit has been already used up, and the mode is changed to the backup mode using the first battery unit.

(Second Operation: Case in which Second Battery Unit Alone is Installed)

There may be a case of not being provided with the first battery unit, and being provided with the second battery unit alone.

Figure 5:
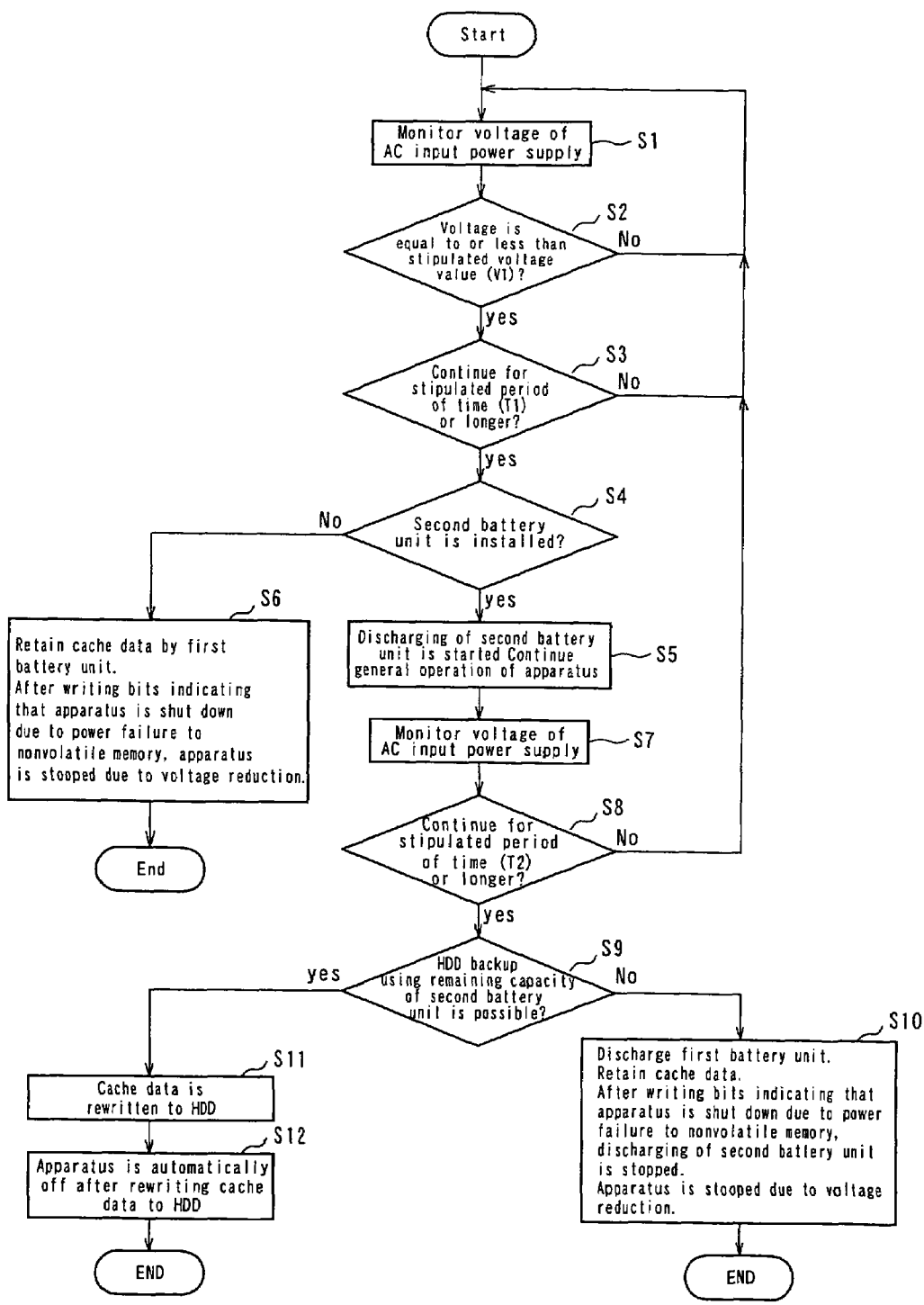
FIG. 5 shows a flow chart indicative of one example of the operation according to the embodiment of the present invention.
Figure 7:
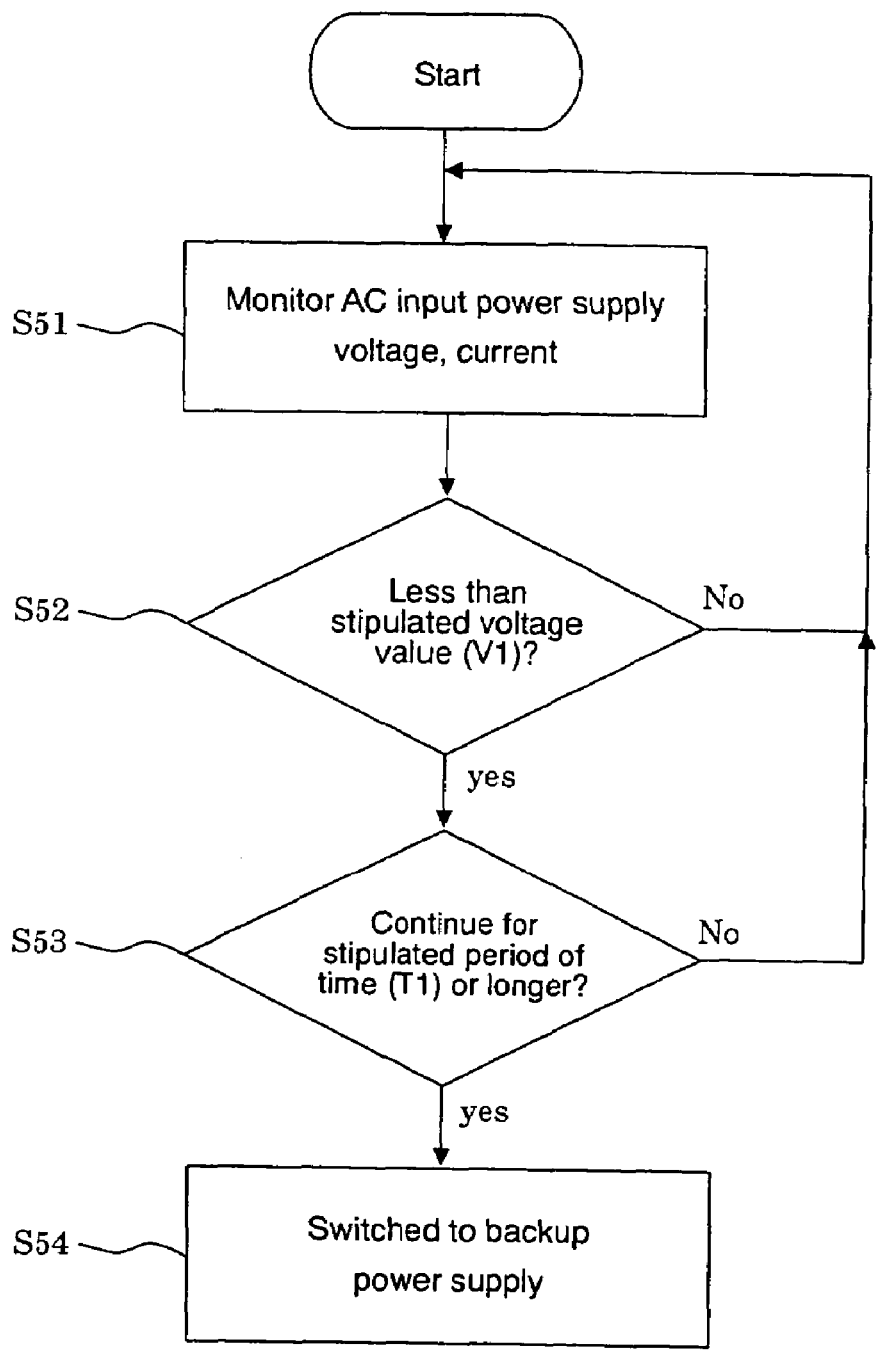
FIG. 7 shows a flow chart indicative of one example of the operation of a conventional power controller.

In this case, in the operation shown in FIG. 5, the stipulated period of time (T2) in step S8 is set up based on electric capacity of the second battery unit, and retention of cache data by the first battery unit in step S10 can be carried out by the second battery unit.

The electric capacity of the second battery unit is sufficiently larger than that of the first battery unit, and the second battery unit can be operated for several ten seconds to several minutes from the time point when a voltage reduction alarm signal is output from the PSU. On the other hand, almost all the power failures are instantaneous power failures less than several seconds, and since the apparatus can be operated using the electric capacity of the second battery unit in such power failures, memory backup can be performed after waiting for the restoration of the commercial power supply voltage for several seconds.

As shown by a dotted line in FIG. 1, when the third battery unit is additionally installed as the second battery unit is additionally installed, the apparatus can be operated during a period of time in which data in the memory is evacuated to the HDD.

(Third Operation: Case in which Dedicated or Commercially Available UPS is Installed)

With an apparatus provided with a dedicated or a commercially available UPS, operation time, memory data protection mode (when the first battery unit is simultaneously used), HDD evacuation mode can be selected by registering the property of the UPS to the structure information of the apparatus structure information storage unit 14.

In this case, for example, since the power controller 1 can determine that a UPS having predetermined electric capacity is installed using stored information of the apparatus structure information storage unit 14, after current application time by the UPS corresponding to the electric capacity of the UPS elapses, operation shown in FIG. 5 (first operation) and above-described second operation can be started. In case of being provided with the UPS alone, the operation of the second battery unit described in the second operation can be replaced with that of the UPS.

In case the UPS is shared by other apparatuses, such as servers, and cannot be used as HDD evacuation mode, the mode comes into memory evacuation mode by registering the installation state as the UPS structure information similarly, making the electric power waiting time most suitable for the shared UPS.

In case of a dedicated UPS, since the state of the UPS can be always monitored, cache memory size corresponding to the electric capacity and operation mode can be dynamically selected, bringing out the performance of the apparatus to the utmost. Furthermore, activity maintenance of the UPS can be possible, and the mode is changed to a mode in which memory backup is possible when the apparatus is operated, and memory backup time extension setup along with additional installation of a battery unit can be dynamically updated.

As in the above, operations of the embodiments are explained corresponding to usage patterns of the backup power supply based on the installation state of the backup power supply, and various installation states are shown in FIG. 6. In FIG. 6, case 1 to case 6 are shown, which respectively correspond to the installation state 1 to installation state 6.

The case 1 is the case in which the first battery unit alone is installed, the case 2 is the case in which the second battery unit alone is installed, the case 3 is the case in which the third battery unit (backup function enlarging unit) is installed to the second battery unit, the case 4 is the case in which the UPS alone is installed, the case 5 is the case in which the first battery unit and the second battery unit are installed, and the case 6 is the case in which the first battery unit and the UPS are installed.

While the invention has been described in accordance with certain preferred embodiments, the invention is not limited to the embodiments. For example, as usage pattern of the backup power supply, data saving has been explained, to which the present invention is not restricted. The kinds of the backup power supply are not restricted to those described in the embodiments. Furthermore, processing from step S1 to step S12 shown in FIG. 5 can be provided as power control programs, and by storing the power control programs in a recording medium which can be read out by a computer, power control by a power controller can be performed by a computer. In the present invention, the recording medium which can be read out by a computer may be a handheld storage medium such as a CD-ROM, flexible disc, DVD disc, magnetic optical disc, and IC card, or data base retaining a computer program, or other computers and their data base, or a line.

What is claimed is:

1. A power controller that controls power of an apparatus provided with first and second backup power supplies for a power supply, comprising:
    a power failure state determination unit that determines the power failure state of the power supply;
    a power supply installation state determination unit that determines the installation states of the first and second backup power supplies of the apparatus; and
    a power control unit that, in case the power failure state is determined by the power failure state determination unit, selects the first or the second backup power supplies based on determination result by the power failure state determination unit and determination result by the power supply installation state determination unit;
    wherein:
        the power failure state determination unit determines plural power failure states corresponding to the usage pattern of the first and second backup power supplies based on the installation state of the first and second backup power supplies which is determined by the power supply installation state determination unit;
        the power failure state determination unit uses time of a timer that clocks time together with the power supply voltage monitoring result; and
        clocks a period of time during which the power supply voltage becomes less than a predetermined value using the timer, and determines a predetermined power failure state based on thus clocked period of time; and
    the power controller controls the first and second backup in an optimal manner so as to backup the power supply upon power failure thereof.

2. The power controller as set forth in claim 1, wherein the power control unit varies drive performance contents of the apparatus as the usage pattern by the first and second backup power supplies depending on the plural power failure states which are determined by the power failure state determination unit.

3. The power controller as set forth in claim 1, wherein the installation state of the first and second backup power supplies that is determined by the power supply installation state determination unit includes information concerning electric capacity of the first and second backup power supplies, or information concerning the electric capacity as well as its charging state.

4. The power controller as set forth in claim 1, wherein
    the power failure state determination unit uses power supply voltage monitoring result by a power supply voltage monitor unit that monitors the voltage of the power supply, and determines a predetermined power failure state under the condition that the power supply voltage becomes less than a predetermined value.

5. The power controller as set forth in claim 4, wherein the power failure state determination unit determines a first power failure state based on the power supply voltage monitoring result, and when the power failure state determination unit determines the first power failure state, in case it is determined that the first backup power supply alone is installed by the power supply installation state determination unit, the power control unit makes a first predetermined processing be performed using the first backup power supply.

6. The power controller as set forth in claim 4, wherein the power failure state determination unit determines a first power failure state based on the power supply voltage monitoring result, and when the power failure state determination unit determines the first power failure state, in case it is determined that the first backup power supply as well as the second backup power supply whose electric capacity is larger than that of the first backup power supply are installed by the power supply installation state determination unit, the power control unit makes a second predetermined processing be performed using the second backup power supply.

7. The power controller as set forth in claim 6, wherein the power failure state determination unit determines a second power failure state under the condition that the state with the power supply voltage less than the predetermined value continues for a preset period of time or longer, and when the power failure state determination unit determines the second power failure state, the power supply installation state determination unit determines remaining amount of the second backup power supply, and, based on the determination result, the power control unit makes the first predetermined processing be performed using any one of the first backup power supply and the second backup power supply.

8. The power controller as set forth in claim 1, further comprising
a power failure history information storage unit that stores power failure history information, wherein
the power control unit controls power using the first and second backup power supplies further based on the power failure history information in addition to determination result by the power failure state determination unit and determination result by the power supply installation state determination unit.

9. An apparatus provided with first and second backup power supplies that back up electric power of a power supply at the time of power failure, comprising:
the first and second backup power supplies having predetermined electric capacity;
a power failure state determination unit that determines the power failure state of the power supply;
a power supply installation state determination unit that determines the installation states of the first and second backup power supplies of the apparatus; and
a power control unit that, in case the power failure state is determined by the power failure state determination unit, selects the first or the second backup power supplies based on determination result by the power failure state determination unit and determination result by the power supply installation state determination unit; wherein:
the power failure state determination unit determines plural power failure states corresponding to the usage pattern of the first and second backup power supplies based on the installation state of the first and second backup power supplies which is determined by the power supply installation state determination unit;
the power failure state determination unit uses time of a timer that clocks time together with the power supply voltage monitoring result; and
clocks a period of time during which the power supply voltage becomes less than a predetermined value using the timer; and determines a predetermined power failure state based on thus clocked period of time; and
the power controller controls the backup power supplies in an optimal manner so as to backup the power supply upon power failure thereof.

10. The apparatus provided with the first and second backup power supplies as set forth in claim 9, wherein
the first backup power supply has a first electric capacity and the second backup power supply has a second electric capacity which is larger than that of the first backup power supply, and
in case the power failure state is determined by the power failure state determination unit, the power control unit selectively switches the first backup power supply and the second backup power supply based on determination result by the power failure state determination unit and determination result by the power supply installation state determination unit to supply the apparatus with power.

11. The apparatus provided with the first and second backup power supplies as set forth in claim 9, wherein the apparatus is a RAID apparatus.

12. A computer readable medium encoded with a computer program for controlling power that makes a computer control power of an apparatus provided with first and second backup power supplies for a power supply, the program makes the computer carry out:
a power failure state determination step of determining the power failure state of the power supply;
a power supply installation state determination step of determining the installation state of the first and second backup power supplies of the apparatus; and
a power control step of, in case the power failure state is determined in the power failure state determination step, selecting the first or the second backup power supplies based on determination result in the power failure state determination step and determination result in the power supply installation state determination step; wherein:
the power failure state determination step determines plural power failure states corresponding to the usage pattern of the first and second backup power supplies based on the installation state of the first and second backup power supplies which is determined by the power supply installation state determination step;
the power failure state determination step uses time of a timer that clocks time together with the power supply voltage monitoring result; and
clocks a period of time during which the power supply voltage becomes less than a predetermined value using the timer, and determines a predetermined power failure state based on thus clocked period of time; and
the power controller controls the backup power supplies in an optimal manner so as to backup the power supply upon power failure thereof.

13. The computer readable medium encoded with a computer program for controlling power as set forth in claim 12, wherein in the power supply installation state determination step, the installation state of the first and second backup power supplies is determined, and in the power failure state determination step, plural power failure states corresponding to the usage pattern of the first and second backup power supplies based on the installation state of the first and second backup power supplies which is determined in the power supply installation state determination step are determined.

14. The computer readable medium encoded with a computer program for controlling power as set forth in claim 13, wherein, in the power control step, drive performance contents of the apparatus as the usage pattern by the first and second backup power supplies are varied depending on the plural power failure states which are determined in the power failure state determination step.

15. The computer readable medium encoded with a computer program for controlling power as set forth in claim 12, wherein in the power failure state determination step, power supply voltage monitoring result by monitoring the voltage of the power supply is used, and a predetermined power failure state is determined under the condition that the power supply voltage becomes less than a predetermined value.

16. The computer readable medium encoded with a computer program for controlling power as set forth in claim 15, wherein, in the power failure state determination step, a predetermined power failure state is determined based on a period of time during which the power supply voltage becomes less than a predetermined value.

17. The computer readable medium encoded with a computer program for controlling power as set forth in claim 15, wherein in the power failure state determination step, a first power failure state is determined based on the power supply voltage monitoring result, and when the first power failure state is determined in the power failure state determination step, in case it is determined that the first backup power supply alone is installed in the power supply installation state determination step, a first predetermined processing is made to be performed using the first backup power supply in the power control step.

18. A method for controlling power that controls power of an apparatus provided with first and second backup power supplies for a power supply, comprising:

a power failure state determination step of determining the power failure state of the power supply;

a power supply installation state determination step of determining the installation state of the first and second backup power supplies of the apparatus; and a power control step of, in case the power failure state is determined in the power failure state determination step, selecting the first or the second backup power supplies based on determination result in the power failure state determination step and determination result in the power supply installation state determination step; wherein:

the power failure state determination step determines plural power failure states corresponding to the usage pattern of the first and second backup power supplies based on the installation state of the first and second backup power supplies which is determined by the power supply installation state determination step;

the power failure state determination step uses time of a timer that clocks time together with the power supply voltage monitoring result; and clocks a period of time during which the power supply voltage becomes less than a predetermined value using the timer, and determines a predetermined power failure state based on thus clocked period of time; and the power controller controls the backup power supplies in an optimal manner so as to backup the power supply upon power failure thereof.

\* \* \* \* \*